(12) United States Patent
Uhm et al.

(10) Patent No.: US 11,852,821 B2
(45) Date of Patent: Dec. 26, 2023

(54) GLASSES-TYPE ELECTRONIC DEVICE INCLUDING FLEXIBLE CIRCUIT BOARD

(71) Applicant: Samsung Electronics Co., Ltd., Suwon-si (KR)

(72) Inventors: Junwhon Uhm, Suwon-si (KR); Hyunmo Yang, Suwon-si (KR); Minseok Kim, Suwon-si (KR); Bumhee Bae, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 59 days.

(21) Appl. No.: 17/538,178

(22) Filed: Nov. 30, 2021

(65) Prior Publication Data

US 2023/0083895 A1 Mar. 16, 2023

Related U.S. Application Data

(63) Continuation of application No. PCT/KR2021/013506, filed on Oct. 1, 2021.

(30) Foreign Application Priority Data

Sep. 10, 2021 (KR) .................. 10-2021-0121104

(51) Int. Cl.
*G02B 27/01* (2006.01)
*G02B 27/64* (2006.01)
*H05K 1/11* (2006.01)

(52) U.S. Cl.
CPC ..... *G02B 27/0172* (2013.01); *G02B 27/0101* (2013.01); *H05K 1/118* (2013.01);
(Continued)

(58) Field of Classification Search
CPC .................. G02B 2027/0178; G02B 27/017
See application file for complete search history.

(56) References Cited

U.S. PATENT DOCUMENTS 10,353,221 B1 * 7/2019 Graff ................ G02C 5/2209
2014/0028966 A1 1/2014 Blum et al.
(Continued)

FOREIGN PATENT DOCUMENTS

KR 10-2019-0066197 A 6/2019
KR 10-2020-0092122 A 8/2020
(Continued)

OTHER PUBLICATIONS

International Search Report dated Jun. 7, 2022, issued in International Patent Application No. PCT/KR2021/013506.

*Primary Examiner* — Nan-Ying Yang
(74) *Attorney, Agent, or Firm* — Jefferson IP Law, LLP

(57) ABSTRACT

A glasses-type electronic device is provided. The glasses-type electronic device includes a lens frame, a camera and a display, a first wearing member extending from one end of the lens frame and including a first printed circuit board (PCB) disposed therein, a second wearing member extending from the other end of the lens frame and including a second PCB disposed therein, and a flexible PCB (FPCB) extending from the first PCB through the lens frame unit and electrically connected to the second PCB. A first wiring line of the FPCB is located in at least a portion of an uppermost layer or a lowermost layer of the FPCB, and a second wiring line of the FPCB is located in at least a portion of an inner layer of the FPCB.

20 Claims, 11 Drawing Sheets

(52) U.S. Cl.
CPC .............. *G02B 2027/014* (2013.01); *G02B 2027/0138* (2013.01); *G02B 2027/0178* (2013.01)

(56) References Cited

U.S. PATENT DOCUMENTS

| | | |
|---|---|---|
| 2019/0198981 A1 | 6/2019 | Moore et al. |
| 2019/0212566 A1 | 7/2019 | Lee et al. |
| 2020/0064635 A1* | 2/2020 | Franklin ............ G02B 27/0176 |
| 2020/0133030 A1* | 4/2020 | Eriksson ............... H02J 7/0044 |
| 2020/0267839 A1* | 8/2020 | Woo ..................... H05K 5/0017 |
| 2020/0379257 A1 | 12/2020 | Lee et al. |
| 2020/0393685 A1 | 12/2020 | Isaacs et al. |
| 2021/0048691 A1 | 2/2021 | Ben-Haim et al. |
| 2021/0096388 A1* | 4/2021 | Hanover ............ H04N 1/00246 |
| 2021/0280964 A1 | 9/2021 | Hong |

FOREIGN PATENT DOCUMENTS

| | | |
|---|---|---|
| KR | 10-2020-0101201 A | 8/2020 |
| KR | 10-2020-0137813 A | 12/2020 |

* cited by examiner ic device, a main PCB may be located in a temple and may be connected to modules, such as a camera and a display, using a flexible printed circuit board (FPCB). However, there are restrictions due to the spatial limitation of the temples.

GLASSES-TYPE ELECTRONIC DEVICE INCLUDING FLEXIBLE CIRCUIT BOARD

CROSS-REFERENCE TO RELATED APPLICATION(S)

This application is a continuation application, claiming priority under § 365(c), of an International application No. PCT/KR2021/013506, filed on Oct. 1, 2021, which is based on and claims the benefit of a Korean patent application number 10-2021-0121104, filed on Sep. 10, 2021, in the Korean Intellectual Property Office, the disclosure of each of which is incorporated by reference herein in its entirety.

BACKGROUND

1. Field

The disclosure relates to a glasses-type electronic device including a flexible circuit board.

2. Description of Related Art

With the development of electronic and communication technologies, electronic devices can be reduced in size and weight to such an extent that the electronic devices can be used without great inconvenience even when the electronic devices are worn on a user's body. For example, wearable electronic devices, such as a head mounting device (HMD), a smartwatch (or band), a contact lens-type device, a ring-type device, a glove-type device, a shoe-type device, or a clothing-type device, are commercially available. Since the wearable electronic devices are directly worn on a user's body, portability and user accessibility may be improved.

A head mounting device is a device used in the state of being worn on a user's head or face and may provide augmented reality (AR) to the user. For example, a head mounting device providing augmented reality may be implemented in the form of glasses, and may provide information about an object in the form of an image or text to the user in at least a partial space of the user's field of view. The head mounting device may provide virtual reality (VR) to the user. For example, by outputting independent images to the user's both eyes, respectively, and outputting a content provided from an external input to the user in the form of an image or sound, the head mounting device may provide an excellent sensation of immersion.

The above information is presented as background information only to assist with an understanding of the disclosure. No determination has been made, and no assertion is made, as to whether any of the above might be applicable as prior art with regard to the disclosure.

SUMMARY

In an electronic device for virtual reality or augmented reality (AR), a main printed circuit board (main PCB) is located in the center (above the forehead) of an AR device, so that the AR device is mainly configured in a goggles type, rather than in a glasses type. The glasses type has a simple monocular configuration or a simple camera-free configuration. In addition, since the main PCB is located in the center of the AR device, the AR device may have a large size. When the user wears the glasses-type AR device, various modules such as a camera and a display included in a glass unit with glasses may be included. In order to develop a slim and lightweight glasses-type AR device, a main PCB may be located in a temple and may be connected to modules, such as a camera and a display, using a flexible printed circuit board (FPCB). However, there are restrictions due to the spatial limitation of the temples.

As the number of data lines to be drawn out from the main PCB and each module increases, the number of FPCBs connecting each module to the main PCB, the overall width of the FPCB, and/or the number of layers of the FPCB may increase, which may result in a decrease in flexibility. This may make it difficult to fold the temples of the glasses-type AR device.

Since it is necessary to dispose connectors for connecting FPCBs to respective modules on the PCB, the PCB becomes larger, which causes an increase in the size of the AR device and which makes it necessary to couple several different FPCBs in the assembly step of coupling the FPCBs to the main PCB, resulting in a complicated structure. Thus, it takes a long time to assemble, which may cause degradation in mass productivity.

In addition, each FPCB includes one or more layers, and the same material used for all the layers of the FPCB. In the AR device structure in which high-speed signals such as mobile industry processor interface (MIPI), peripheral component interconnect express (PCIe), and radio frequency (RF) signals are individually connected to the left eye or the right eye, there may be a signal loss due to the multiple FPCBs.

Aspects of the disclosure are to address at least the above-mentioned problems and/or disadvantages and to provide at least the advantages described below. Accordingly, an aspect of the disclosure is to provide a glasses-type AR device, which is miniaturized and lightened in order to improve portability and convenience for a user, and may include integrated components in a small space for high performance.

Another aspect of the disclosure is to provide a glasses-type AR device capable of transmitting a low-loss, high-speed signal while being miniaturized, by using a single FPCB when connecting a main system and different modules.

Additional aspects will be set forth in part in the description which follows and, in part, will be apparent from the description, or may be learned by practice of the presented embodiments.

In accordance with an aspect of the disclosure, a glasses-type electronic device is provided. The glasses-type electronic device includes a housing, a lens frame unit disposed in the housing, a camera module and a display module disposed in the lens frame unit, a first wearing unit extending from one end of the lens frame unit and including a first PCB disposed therein, a second wearing unit extending from the other end of the lens frame unit and including a second PCB disposed therein, and a flexible PCB (FPCB) extending from the first PCB through the lens frame unit and connected to the second PCB.

In accordance with another aspect of the disclosure, a glasses-type electronic device is provided. The glasses-type electronic device includes a lens frame unit, a first wearing unit extending from one end of the lens frame unit and including a first PCB disposed therein, a second wearing unit extending from the other end of the lens frame unit and including a second PCB disposed therein, and a flexible PCB (FPCB) extending from the first PCB through the lens frame unit and connected to the second PCB. The FPCB may be electrically connected to each of modules for a first signal and a second signal, a first wiring line of the FPCB that is connected to the module for the first signal is located in at least a portion of an uppermost layer or a lowermost layer of the FPCB, and a second wiring line of the FPCB for the second signal is located in at least a portion of an inner layer of the FPCB, wherein the first signal has a speed higher than that of the second signal.

In accordance with another aspect of the disclosure, a glasses-type electronic device is provided. The glasses-type electronic device includes a flexible PCB (FPCB), a main PCB electrically connected to an end of the FPCB, and a sub-PCB electrically connected to the other end of the FPCB. At least a partial area of the FPCB may include a connector configured to be connectable to one or more components of the glasses-type electronic device. The FPCB may include a plurality of layers configured to provide a power or signal wiring line and may include, in the plurality of layers, a first wiring line for a first signal, which is disposed in at least one of the uppermost layer or the lowermost layer of the layers that provide the signal wiring line, and a second wiring line for a second signal, which is disposed in an inner layer disposed between the uppermost layer and the lowermost layer, wherein the first signal may have a higher speed than that of the second signal.

In an AR electronic device according to various embodiments of the disclosure, by using a single FPCB, it is possible to miniaturize the AR electronic device and to improve high-speed signal transmission.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
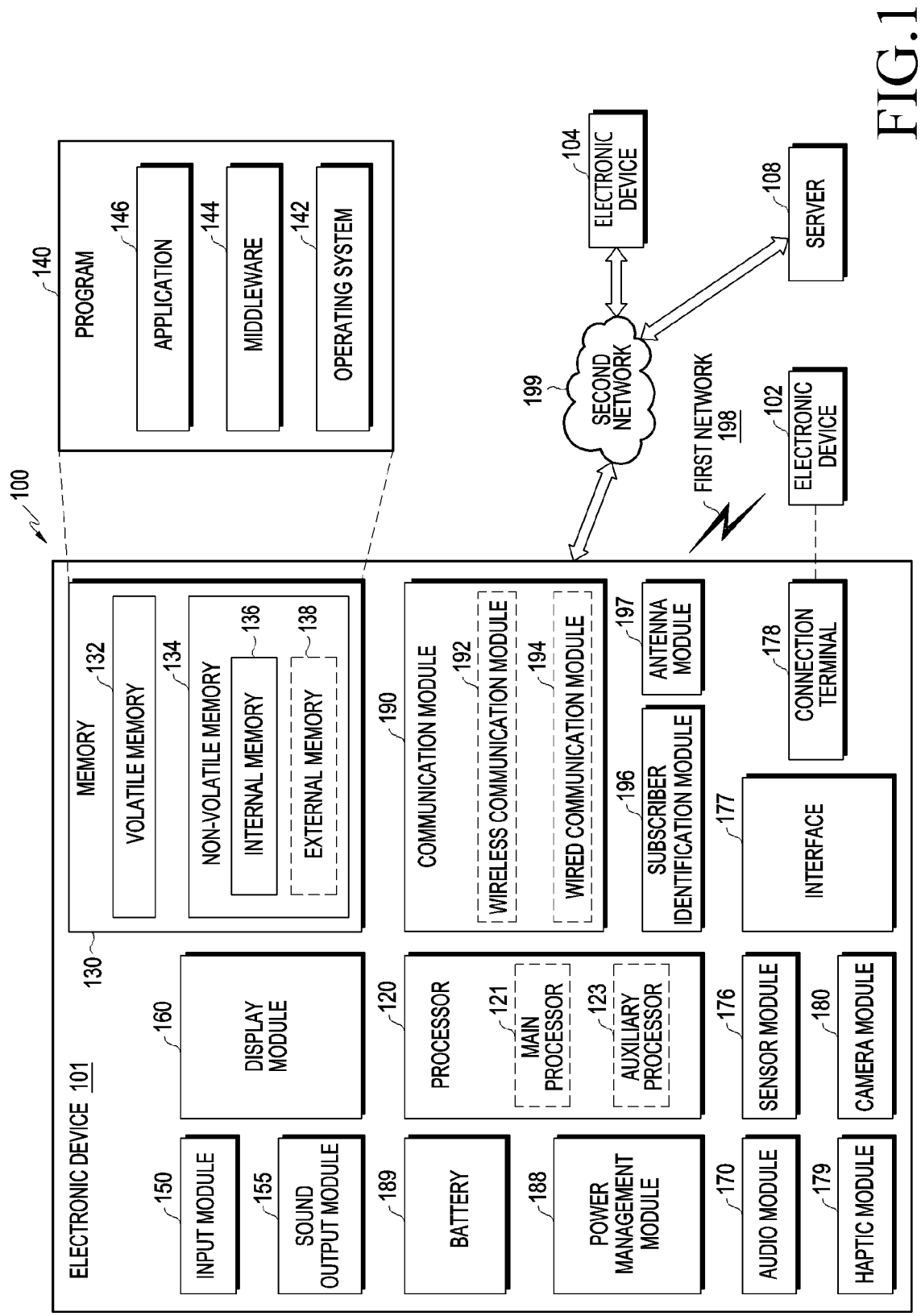
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or an external electronic device 104 or a server 108 via a second network 199 (e.g., a long-range wireless communication network). According to an embodiment, the electronic device 101 may communicate with the external electronic device 104 via the server 108. According to an embodiment, the electronic device 101 may include a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control, for example, at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active (e.g., executing an application) state. According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory may include an internal memory 136 and an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or an external electronic device (e.g., the external electronic device 102 (e.g., a speaker or a headphone)) directly or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly or wirelessly. According to an embodiment, the interface 177 may include, for example, a high definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the external electronic device 102). According to an embodiment, the connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 or 104 may be a device of a same type as, or a different type, from the electronic device 101. According to an embodiment, all or some of operations to be executed at the electronic device 101 may be executed at one or more of the external electronic devices 102 and 104 or the server 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to various embodiments, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
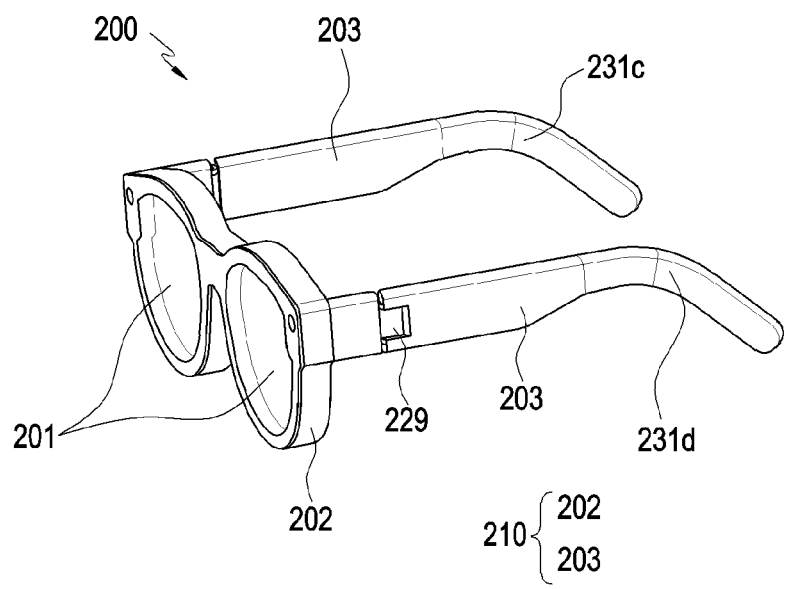
FIG. 2 is a perspective view illustrating an electronic device according to an embodiment of the disclosure.

FIG. 2 is a perspective view illustrating an electronic device according to an embodiment of the disclosure.

Referring to FIG. 2, an electronic device 200 is a glasses-type wearable electronic device, and a user may visually recognize a surrounding object or environment in the state of wearing the electronic device 200. For example, the electronic device 200 may be a head mounting device (HMD) or smart glasses capable of providing an image directly in front of the user's eyes. All or some of the components of the electronic device 200 of FIG. 2 may be all or partially the same as those of the electronic device 101 of FIG. 1.

According to various embodiments, the electronic device 200 may include a housing 210 that defines an external appearance of the electronic device 200. The housing 210 may provide a space in which components of the electronic device 200 may be disposed. For example, the housing 210 may include a lens frame unit 202 and at least one wearing member (e.g., wearing members 203) including a first wearing member (e.g., a first wearing member 203a in FIG. 3) and a second wearing member (e.g., a second wearing member 203b in FIG. 3).

According to various embodiments, the electronic device 200 may include at least one display member (e.g., display members 201) capable of providing visual information to the user. For example, the display members 201 may include a module equipped with a glass, a lens, a display, a waveguide, and/or a touch circuit. According to an embodiment, the display members 201 may be transparent or translucent. According to an embodiment, the display members 201 may include a translucent glass or a window member capable of adjusting the transmittance of light by adjusting the color concentration thereof. According to an embodiment, a pair of display members 201 may be provided and may be disposed to correspond to the left eye and the right eye of the user, respectively, in the state in which the electronic device 200 is worn on the user's body.

According to various embodiments, the lens frame unit 202 may accommodate at least a portion of each display member 201. For example, the lens frame unit 202 may surround at least a portion of the edge of each display member 201. According to an embodiment, the lens frame unit 202 may cause at least one of the display members 201 to be located to correspond to one of the user's eyes. According to an embodiment, the lens frame unit 202 may be a rim having a general eyeglass structure. According to an embodiment, the lens frame unit 202 may include at least one closed curve surrounding the display members 201.

According to various embodiments, the wearing members 203 may extend from the lens frame unit 202. For example, the wearing members 203 may extend from the ends of the lens frame unit 202, and may be supported or positioned on the user's body (e.g., ears) together with the lens frame unit 202. According to an embodiment, the wearing members 203 may be rotatably coupled to the lens frame unit 202 via hinge structures 229. According to an embodiment, each wearing member 203 may include an inner surface 231c configured to face the user's body and an outer surface 231d opposite to the inner surface.

According to various embodiments, the electronic device 200 may include hinge structures 229, each of which is configured to enable one of the wearing members 203 to be folded with respect to the lens frame unit 202. Each of the hinge structures 229 may be disposed between the lens frame unit 202 and each wearing member 203. In the state in which the electronic device 200 is not worn, the user may carry or store the electronic device 200 in the state in which the wearing members 203 are folded to partially overlap the lens frame unit 202.

Figure 3:
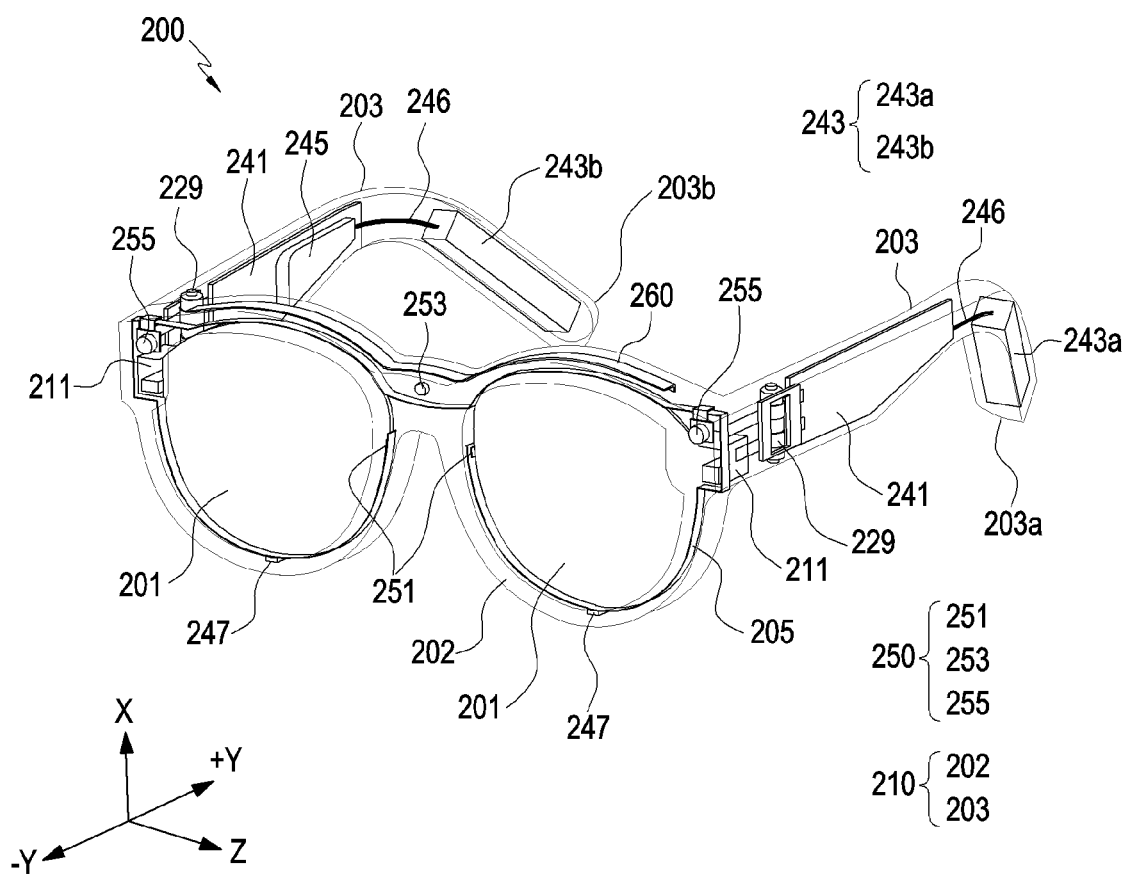
FIG. 3 is a perspective view for describing an internal configuration of an electronic device according to an embodiment of the disclosure.
Figure 4:
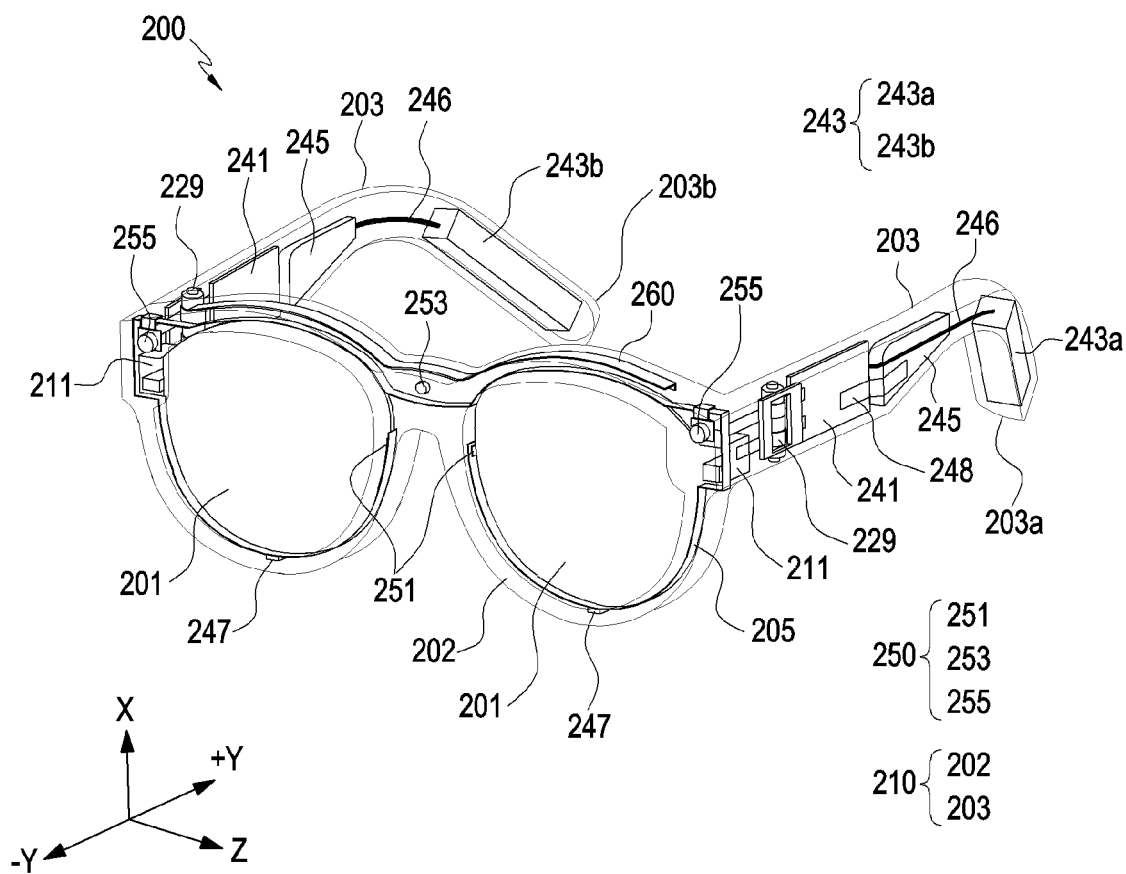
FIG. 4 is a perspective view for describing an internal configuration of an electronic device according to an embodiment of the disclosure.
Figure 5:
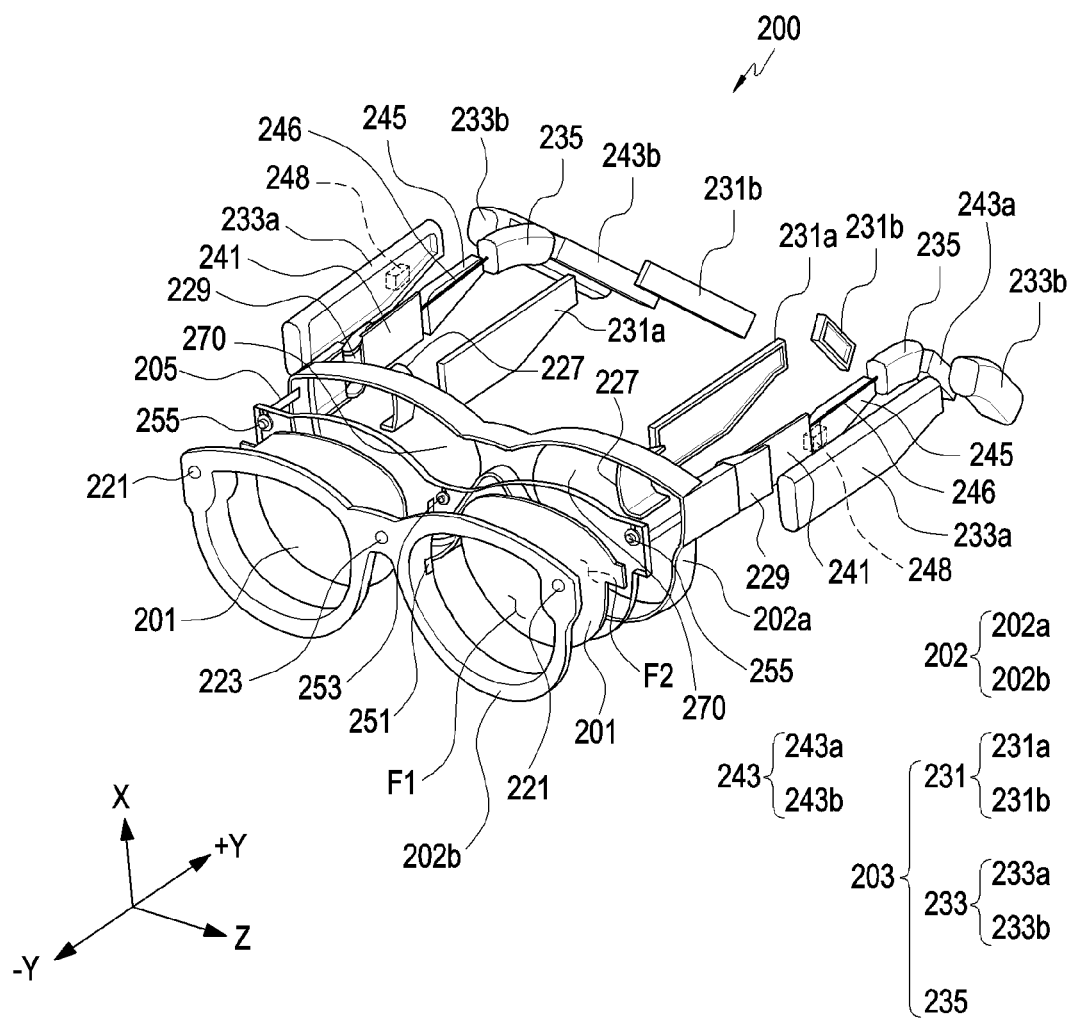
FIG. 5 is an exploded perspective view illustrating an electronic device according to an embodiment of the disclosure.

FIG. 3 is a perspective view for describing an internal configuration of an electronic device according to an embodiment of the disclosure. FIG. 4 is a perspective view for describing an internal configuration of an electronic device according to an embodiment of the disclosure. FIG. 5 is an exploded perspective view illustrating an electronic device according to an embodiment of the disclosure.

Referring to FIGS. 3 to 5, the electronic device 200 may include components (e.g., at least one circuit board 241 (e.g., a printed circuit board (PCB), a printed board assembly (PBA), a flexible PCB (FPCB), or a rigid-flex PCB (RFPCB)), at least one battery 243, at least one speaker module 245, at least one power transmission structure 246, and a camera module 250), which are accommodated in the housing 210. All or some of the components of the housing 210 of FIGS. 3 and 4 may be the same as the configurations of the display members 201, the lens frame unit 202, the first and second wearing members 203a and 203b, and the hinge structures 229 of FIG. 2.

According to various embodiments, the electronic device 200 may acquire and/or recognize visual images regarding an object or environment in a direction, in which the user gazes or the electronic device 200 is oriented (e.g., the −Y direction) using the camera module 250 (e.g., the camera module 180 in FIG. 1) and may receive information about the object or environment from an external electronic device (e.g., the external electronic devices 102 and 104 or the server 108 in FIG. 1) via a network (e.g., the first network 198 or the second network 199 in FIG. 1). In another embodiment, the electronic device 200 may provide the provided information about the object or environment to the user in an acoustic or visual form. The electronic device 200 may provide the received information about the object or environment to the user via the display members 201 in a visual form using a display module (e.g., the display module 160 in FIG. 1). For example, the electronic device 200 may implement augmented reality by implementing the information about the object or environment in a visual form and combining the information with an actual image of the environment around the user.

According to various embodiments of the disclosure, each display member 201 may include a first surface F1 oriented in a direction (e.g., in the −Y direction) in which external light is incident and a second surface F2 facing away from the first surface F1 (e.g., in the +Y direction). In the state in which the user wears the electronic device 200, at least a part of the light or image incident through the first surface F1 may pass through the second surfaces F2 of the display members 201, which are disposed to face the user's left eye and/or right eye to be incident to the user's left eye and/or right eye.

According to various embodiments, the lens frame unit 202 may include at least two frames. For example, the lens frame unit 202 may include a first frame 202a and a second frame 202b. According to an embodiment, when the user wears the electronic device 200, the first frame 202a may be a frame of a portion facing the user's face, and the second frame 202b may be a portion of the lens frame unit 202 spaced apart from the first frame 202a in the user's gazing direction (e.g., −Y direction).

According to various embodiments, the light output modules 211 may provide an image and/or a picture to the user. For example, the light output modules 211 may include display panels (not illustrated) capable of outputting an image, and lenses (not illustrated) corresponding to the user's eyes and configured to guide the image to the display members 201. For example, the user may acquire an image output from the display panels of the light output modules 211 through the lenses of the light output modules 211. According to various embodiments, each light output module 211 may include a device configured to display various pieces of information. For example, each light output module 211 may include at least one of a liquid crystal display (LCD), a digital mirror device (DMD), a liquid crystal-on-silicon (LCoS) display device, an organic light-emitting diode, an organic light-emitting diode (OLED), or a micro light emitting diode (a micro-LED). According to an embodiment, when each light output module 211 and/or each display member 201 include one of a liquid crystal display device, a digital mirror display device, or a silicon liquid crystal display device, the electronic device 200 may include a light source configured to emit light to a display area of each light output module 211 and/or each display member 201. According to another embodiment, when each light output module 211 and/or each display member 201 include one of an organic light emitting diode or a micro-LED, the electronic device 200 may provide a virtual image to the user without including a separate light source.

According to various embodiments, at least a portion of each light output module 211 may be disposed in the housing 210. For example, the light output modules 211 may be disposed on the first wearing member 203a and the second wearing member 203b, or the lens frame unit 202 to correspond to the user's left eye and right eye, respectively. According to an embodiment, the light output modules 211 may be connected to the display members 201, respectively, and may provide an image to the user via the display members 201.

According to various embodiments, each circuit board 241 may include components for driving the electronic device 200. For example, each circuit board 241 may include at least one integrated circuit chip, and at least one of a processor 120, a memory 130, the power management module 188, or a communication module of FIG. 1 may be provided in the integrated circuit chip. According to an embodiment, the circuit boards 241 may be disposed in the wearing members 203 of the housing 210, respectively. According to an embodiment, the circuit boards 241 may be electrically connected to the batteries 243 via power transmission structures 246, respectively. According to an embodiment, the circuit boards 241 may be connected to a flexible printed circuit board 205 and may transmit electrical signals to electronic components (e.g., the light output modules 211, the camera module 250, and a light emitter (not illustrated)) of the electronic device via the flexible printed circuit board 205. According to an embodiment, the circuit boards 241 may be interposer substrates.

According to various embodiments, the flexible printed circuit boards 205 may extend respectively from the circuit boards 241 across the hinge structures 229 into the inside of the lens frame unit 202 and may be disposed on at least portions of peripheries of the display members 201 in the inside of the lens frame unit 202.

According to various embodiments, the batteries 243 (e.g., the battery 189 in FIG. 1) may be electrically connected to the components (e.g., the light output modules 211, the circuit boards 241, the speaker modules 245, microphone modules 247, and/or the camera module 250) of the electronic device 200, and may supply power to the components of the electronic device 200.

According to various embodiments, at least a portion of each battery 243 may be disposed on one of the wearing members 203. According to an embodiment, the batteries 243 may be disposed adjacent to the ends of the wearing members 203, respectively. For example, the batteries 243 may include a first battery 243a disposed in the first wearing member 203a and a second battery 243b disposed in the second wearing member 203b.

According to various embodiments, the speaker modules 245 (e.g., the audio module 170 or the sound output module 155 in FIG. 1) may convert an electrical signal into sound. At least a portion of each speaker module 245 may be disposed in one of the wearing members 203 of the housing 210. According to an embodiment, the speaker modules 245 may be located in the wearing members 203 to correspond to the user's ears, respectively. According to an embodiment (e.g., FIG. 3), the speaker modules 245 may be disposed on the circuit boards 241, respectively. For example, the speaker modules 245 may be disposed between the circuit boards 241 and the inner cases (e.g., inner cases 231 in FIG. 5), respectively. According to an embodiment (e.g., FIG. 4), the speaker modules 245 may be disposed next to the circuit boards 241, respectively. For example, the speaker modules 245 may be disposed between the circuit boards 241 and the batteries 243, respectively.

According to various embodiments, the electronic device 200 may include connection members 248 that are connected to the speaker modules 245 and the circuit boards 241, respectively. The connection members 248 may transmit at least a part of the sound and/or vibration generated by the speaker modules 245 to the circuit boards 241, respectively. According to an embodiment, the connection members 248 may be integrally formed with the speaker modules 245, respectively. For example, portions extending from speaker frames (e.g., the speaker frames 314 in FIG. 6) of the speaker modules 245 may be interpreted as the connection members 248. The configuration of the connection members 248 will be further described below with reference to FIGS. 10A and 10B. According to an embodiment (e.g., FIG. 3), the connection members 248 may be omitted. For example, when the speaker modules 245 are disposed on the circuit boards 241, respectively, the connection members 248 may be omitted.

According to various embodiments, the power transmission structures 246 may transmit power from the batteries 243 to electronic components (e.g., the light output modules 211) of the electronic device 200. For example, the power transmission structures 246 may be electrically connected to the batteries 243 and/or the circuit boards 241, and the circuit boards 241 may transmit power received via the power transmission structures 246 to the light output modules 211, respectively.

According to various embodiments, the power transmission structures 246 may be configurations capable of transmitting power. For example, each power delivery structure 246 may include a flexible printed circuit board or a wire. For example, the wire may include a plurality of cables (not illustrated). In various embodiments, the shape of the power transmission structures 246 may be variously modified in consideration of the number and/or type of cables, or the like.

According to various embodiments, the microphone modules 247 (e.g., the input module 150 and/or the audio module 170 in FIG. 1) may convert sound into an electrical signal. According to an embodiment, the microphone modules 247 may be disposed on at least a portion of the lens frame unit 202. For example, one or more microphone modules 247 may be disposed at a lower end (e.g., in the −X-axis direction) and/or an upper end (e.g., the X-axis direction) of the electronic device 200. According to various embodiments, the electronic device 200 may more clearly recognize the user's voice using voice information (e.g., sound) acquired from the one or more microphone modules 247. For example, on the basis of the acquired voice information and/or additional information (e.g., low-frequency vibration of the user's skin and bone), the electronic device 200 may distinguish voice information and ambient noise from each other. For example, the electronic device 200 may clearly recognize the user's voice and may perform a function of reducing ambient noise (e.g., noise canceling).

According to various embodiments, the camera module 250 may capture a still image and/or a moving image. The camera module 250 may include at least one of a lens, at least one image sensor, an image signal processor, or a flash. According to an embodiment, the camera module 250 may be disposed in the lens frame unit 202 and in the vicinity of the display members 201.

According to various embodiments, the camera module 250 may include one or more first camera modules 251. According to an embodiment, the first camera modules 251 may photograph the trajectory of the user's eyes (e.g., pupils) or gaze. For example, the first camera modules 251 may photograph a reflection pattern of light emitted by a light emitter (not illustrated) to the user's eyes. For example, the light emitter (not illustrated) may emit light in an infrared band for tracking the trajectory of the gaze using the first camera modules 251. For example, the light emitter (not illustrated) may include an IR LED. According to an embodiment, in order to make a virtual image projected to each display member 201 correspond to the direction at which the user's pupils gaze, the processor (e.g., the processor 120 in FIG. 1) may adjust the position of the virtual image. According to an embodiment, the first camera modules 251 may include a global shutter (GS) type cameras, and it is possible to track the trajectory of the user's eyes or gaze using the plurality of first camera modules 251 having the same standard and performance.

According to various embodiments, the first camera modules 251 may periodically or aperiodically transmit information related to the trajectory of the user's eyes or gaze (e.g., trajectory information) to the processor (e.g., the processor 120 in FIG. 1). According to another embodiment, the first camera modules 251 may transmit the trajectory information to the processor when detecting that the user's gaze has changed based on the trajectory information (e.g., when the eyes have moved more than a reference value in the state in which the head is not moving).

According to various embodiments, the camera module 250 may include a second camera module 253. According to an embodiment, the second camera module 253 may capture an external image. According to an embodiment, the second camera module 253 may be a global shutter type or rolling shutter (RS) type camera. According to an embodiment, the second camera module 253 may capture an external image through a second optical hole 223 formed in the second frame 202b. For example, the second camera module 253 may include a high-resolution color camera, and may be a high resolution (HR) or photo video (PV) camera. In addition, the second camera module 253 may provide an auto focus (AF) function and an optical image stabilizer (OIS) function.

According to various embodiments (not illustrated), the electronic device 200 may include a flash (not illustrated) located adjacent to the second camera module 253. For example, the flash (not illustrated) may provide light for increasing the brightness (e.g., illuminance) around the electronic device 200 when acquiring an external image of the second camera module 253, and may reduce difficulty of acquiring an image due to a dark environment, mixing of various light sources, and/or reflection of light.

According to various embodiments, the camera module 250 may include at least one third camera module 255. According to an embodiment, the third camera module 255 may photograph a user's motion through a first optical hole 221 provided in the lens frame unit 202. For example, the third camera module 255 may photograph the user's gesture (e.g., a hand gesture). The third camera module 255 and/or the first optical hole 221 may be disposed at each of the opposite ends of the lens frame unit 202 (e.g., the second frame 202b), for example, the opposite ends of the lens frame unit 202 (e.g., the second frame 202b) in the X direction. According to an embodiment, the third camera module 255 may be a global shutter (GS) type camera. For example, the third camera module 255 may provide 360-degree spatial (e.g., omnidirectional) or positional recognition and/or movement recognition using a camera that supports 3 degrees of freedom (DoF) or 6DoF. According to an embodiment, the third camera module 255 may perform a movement path tracking function (simultaneous localization and mapping (SLAM)) and a user movement recognition function using a plurality of global shutter type cameras of the same standard and performance as stereo cameras. According to an embodiment, the third camera module 255 may include an infrared (IR) camera (e.g., a time of flight (ToF) camera or a structured light camera). For example, the IR camera may be operated as at least a part of a sensor module (e.g., the sensor module 176 in FIG. 1) for detecting a distance to a subject.

According to an embodiment, at least one of the first camera modules 251 or the third camera module 255 may be replaced with a sensor module (e.g., the sensor module 176 in FIG. 1). For example, the sensor module may include at least one of a vertical cavity surface emitting laser (VCSEL), an infrared sensor, and/or a photodiode. For example, the photodiode may include a positive intrinsic negative (PIN) photodiode or an avalanche photodiode (APD). The photodiode may be referred to as a photo detector or a photo sensor.

According to an embodiment, at least one of the first camera modules 251, the second camera module 253, or the third camera module 255 may include a plurality of camera modules (not illustrated). For example, the second camera module 253 may include a plurality of lenses (e.g., wide-angle and telephoto lenses) and image sensors and may be disposed on one side (e.g., a surface oriented in the −Y-axis direction) of the electronic device 200. For example, the electronic device 200 may include a plurality of camera modules having different attributes (e.g., angles of view) or functions, respectively, and may control the camera modules to change the angles of view thereof based on the user's selection and/or trajectory information. For example, at least one of the plurality of camera modules may be a wide-angle camera, and at least another one of the camera modules may be a telephoto camera.

According to various embodiments, the processor (e.g., the processor 120 in FIG. 1) may determine the movement of the electronic device 200 and/or the user's movement using the information of the electronic device 200 acquired using at least one of the gesture sensor, the gyro sensor, or the acceleration sensor of the sensor module (e.g., the sensor module 176 in FIG. 1) and the user's movement (e.g., the approach of the user's body to the electronic device 200) acquired using the third camera module 255. According to an embodiment, in addition to the above-described sensors, the electronic device 200 may include a magnetic (geomagnetic) sensor capable of measuring an azimuth using a magnetic field and a line of magnetic force and/or a Hall sensor capable of acquiring movement information (e.g., a movement direction or a movement distance) using the intensity of the magnetic field. For example, the processor may determine the movement of the electronic device 200 and/or the movement of the user based on information acquired from a magnetic (geomagnetic) sensor and/or a Hall sensor.

According to various embodiments (not illustrated), the electronic device 200 may perform an input function (e.g., a touch and/or a pressure detection function) capable of interacting with the user. For example, components configured to perform a touch and/or a pressure detection function (e.g., a touch sensor and/or a pressure sensor) may be disposed on at least a portion of the wearing members 203. The electronic device 200 may control a virtual image output through the display members 201 based on the information acquired via the components. For example, the sensors related to a touch and/or a pressure detection function may be configured in various types, such as a resistive type, a capacitive type, an electro-magnetic (EM) type, or an optical type. According to an embodiment, all or some of the components configured to perform a touch and/or a pressure detection function may be the same as those of the input module 150 of FIG. 1.

According to various embodiments, the electronic device 200 may include a reinforcing member 260 disposed in the internal space of the lens frame unit 202 and configured to have a higher rigidity than that of the lens frame unit 202.

According to various embodiments, the electronic device 200 may include lens structures 270. The lens structures 270 may refract at least a part of light. For example, the lens structures 270 may be prescription lenses having a specified refractive power. According to an embodiment, the lens structures 270 may be disposed at a rear side (e.g., in the +Y direction) of the window member of each display member 201. For example, the lens structures 270 may be positioned between the display members 201 and the user's eyes. For example, each lens structure 270 may face one surface (e.g., second case 231b in FIG. 5) of each corresponding display member 201.

According to various embodiments, the housing 210 may include hinge covers 227 each of which is capable of concealing a portion of each corresponding hinge structure 229. The other portion of each hinge structure 229 may be accommodated or concealed between an inner case 231 and an outer case 233, which will be described later.

According to various embodiments, each wearing member 203 may include an inner case 231 and an outer case 233. The inner case 231 is, for example, a case configured to face the user's body or to come into direct contact with the user's body, and may be made of a material having a low thermal conductivity (e.g., a synthetic resin). According to an embodiment, the inner case 231 may include an inner surface (e.g., the inner surface 231c in FIG. 2) facing the user's body. The outer case 233 may include, for example, a material (e.g., a metal material) capable of at least partially transferring heat, and may be coupled to face the inner case 231. According to an embodiment, the outer case 233 may include an outer surface (e.g., the outer surface 231d in FIG. 2) opposite to the inner surface 231c. In an embodiment, at least one of the circuit boards 241 or the speaker modules 245 may be accommodated in a space separated from at least one battery 243 within the corresponding wearing member 203. In the illustrated embodiment, the inner case 231 may include a first case 231a including at least one circuit board 241 and/or the at least one speaker module 245 and a second case 231b configured to accommodate at least one battery 243, and the outer case 233 may include a third case 233a coupled to face the first case 231a and a fourth case 233b coupled to face the second case 231b. For example, the first case 231a and the third case 233a (hereinafter, "first case parts 231a and 233a") may be coupled to accommodate the at least one circuit board 241 and/or the at least one speaker module 245, and the second case 231b and the fourth case 233b (hereinafter, "second case parts 231b and 233b") may be coupled to accommodate at least one battery 243.

According to various embodiments, the first case parts 231a and 233a may be rotatably coupled to the lens frame unit 202 via the hinge structures 229, and the second case parts 231b and 233b may be connected to or mounted on the ends of the first case parts 231a and 233a via connection structures 235. In some embodiments, the portions of the connection structures 235 that come into contact with the user's body may be made of a material having low thermal conductivity (e.g., an elastic material such as silicone, polyurethane, or rubber), and the portions that do not come into contact with the user's body may be made of a material having a high thermal conductivity (e.g., a metal material). For example, when heat is generated from the circuit boards 241 or the batteries 243, the connection structures 235 block heat from being transferred to portions that come into contact with the user's body, and may distribute or release heat through the portions that do not come into contact with the user's body. According to an embodiment, the portions of the connection structures 235 that are configured to come into contact with the user's body may be interpreted as portions of the inner cases 231, and the portions of the connection structures 235 that do not come into contact with the user's body may be interpreted as portions of the outer cases 233. According to an embodiment (not illustrated), the first case 231a and the second case 231b may be integrally configured without the connection structures 235, and the third case 233a and the fourth case 233b may be integrally configured to each other without the connection structures 235. According to various embodiments, in addition to the illustrated components, other components (e.g., the antenna module 197 of FIG. 1) may be further included, and information about an object or environment may be provided from an external electronic device (e.g., the external electronic device 102 or 104 or the server 108 in FIG. 1) using the communication module 190 via a network (e.g., the first network 198 or the second network 199 in FIG. 1).

According to an embodiment, an FPCB (e.g., FPCB 720 in FIG. 7B) in the electronic device 200 may be further connected to an eye tracking module.

Referring to FIGS. 6 to 10B, the electronic device 200 may include the components accommodated in the housing 210 (e.g., at least one circuit board 241, a flexible PCB (FPCB), the wireless communication module 192, and at least one battery 243, at least one speaker module 245, and the camera module 250) and at least one connection member 248 connected to the at least one circuit board 241.

All or some of the components of the housing 210 of FIGS. 6 to 10B may be the same as the configurations of the display members 201, the lens frame unit 202, the wearing members 203, the hinge structures 229, and the at least one power transmission structure 246 described with reference to FIGS. 1 to 5.

Figure 6:
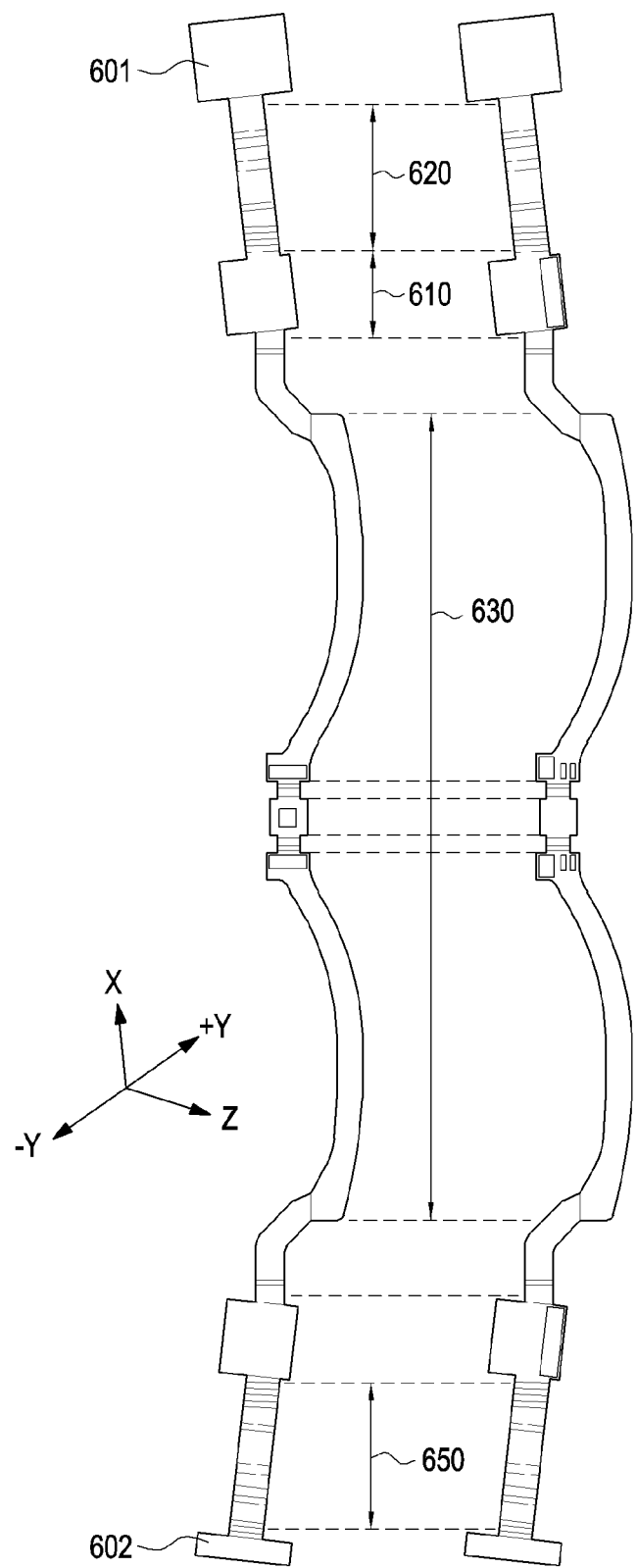
FIG. 6 is a view illustrating an FPCB structure according to an embodiment of the disclosure.

FIG. 6 is a view illustrating an FPCB structure according to an embodiment of the disclosure.

Referring to FIG. 6, an electronic device 200 may include a main PCB (e.g., a first PCB 601 in FIG. 6) among one or more circuit boards 241. The first PCB (e.g., the first PCB 601 in FIG. 6 or first PCB 711 in FIG. 7B) may be a board including at least one layer. The first PCB may be connected to the components accommodated in the housing 210 via a hotbar (e.g., hotbar 701 of FIG. 7B) or a connector (not illustrated). The first PCB (e.g., the first PCB 601 in FIG. 6 or the first PCB 711 in FIG. 7B) may be located in one temple (e.g., the right temple in FIG. 7B). At least one electronic component (e.g., the first PCB 711 of FIG. 7B) (e.g., an AP memory, a CAM PMIC, or an AMP) may be mounted on the first PCB (e.g., the first PCB 601 in FIG. 6 or the first PCB 711 in FIG. 7B). The first PCB (e.g., the first PCB 601 of FIG. 6 or the first PCB 711 of FIG. 7B) may be connected to a battery (e.g., at least one battery 243 in FIG. 5) and an SPK located at a terminal end of the temple.

According to various embodiments, the electronic device 200 may include a sub-PCB (e.g., a second PCB 602 in FIG. 6) among one or more circuit boards 241. The second PCB (e.g., the second PCB 602 in FIG. 6 or second PCB 712 in FIG. 7B) may be a board including at least one layer. The second PCB (e.g., the second PCB 602 in FIG. 6 or the second PCB 712 in FIG. 7B) may be connected to components accommodated in the housing 210 via a hotbar (not illustrated) or a connector (e.g., connector 703 in FIG. 7B). The second PCB may be located on the other temple (e.g., the left temple in FIG. 7B). At least one electronic component (e.g., the second PCB 712 in FIG. 7B) (e.g., a touch IC, an IR driver, Wi-Fi, power, an AMP, or an MIC) may be mounted on the second PCB (e.g., the second PCB 602 in FIG. 6 or the second PCB 712 in FIG. 7B). The second PCB (e.g., the second PCB 602 in FIG. 6 or the second PCB 712 in FIG. 7B) may be connected to a battery (e.g., at least one battery 243 in FIG. 5) and an SPK located at the terminal end of the temple. A single FPCB (e.g., the FPCB 720 in FIG. 7B) may electrically connect the first PCB (e.g., the first PCB 711 in FIG. 7B) and the second PCB (e.g., the second PCB 712 in FIG. 7B) to each other, and according to an embodiment, may be electrically connected to a battery(s) located at the terminal end of the temple.

According to various embodiments, the electronic device 200 may include an FPCB (e.g., the FPCB 720 in FIG. 7B) electrically connected to a first PCB (e.g., the first PCB 711 in FIG. 7B), a second PCB (e.g., the second PCB 712 in FIG. 7B), and components accommodated in the housing 210. The FPCB (e.g., the FPCB 720 in FIG. 7B) may be located on at least some of the display members 201, the lens frame unit 202, the wearing members 203, the hinge structures 229, and the power transmission structures 246 described with reference to FIGS. 1 to 5.

Figure 7A:
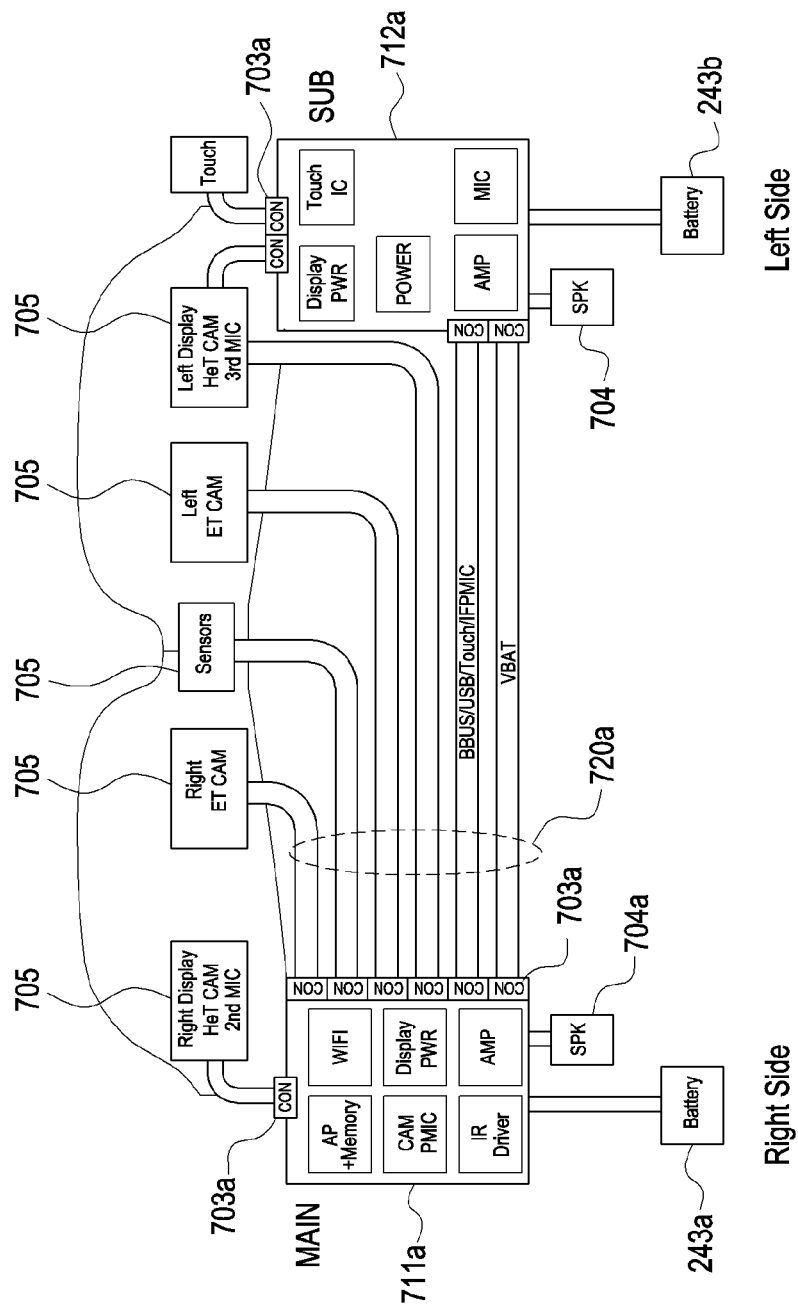
FIG. 7A illustrates a method of connecting FPCBs and modules to each other in a glasses-type electronic device of the related art, according to an embodiment of the disclosure.
Figure 7B:
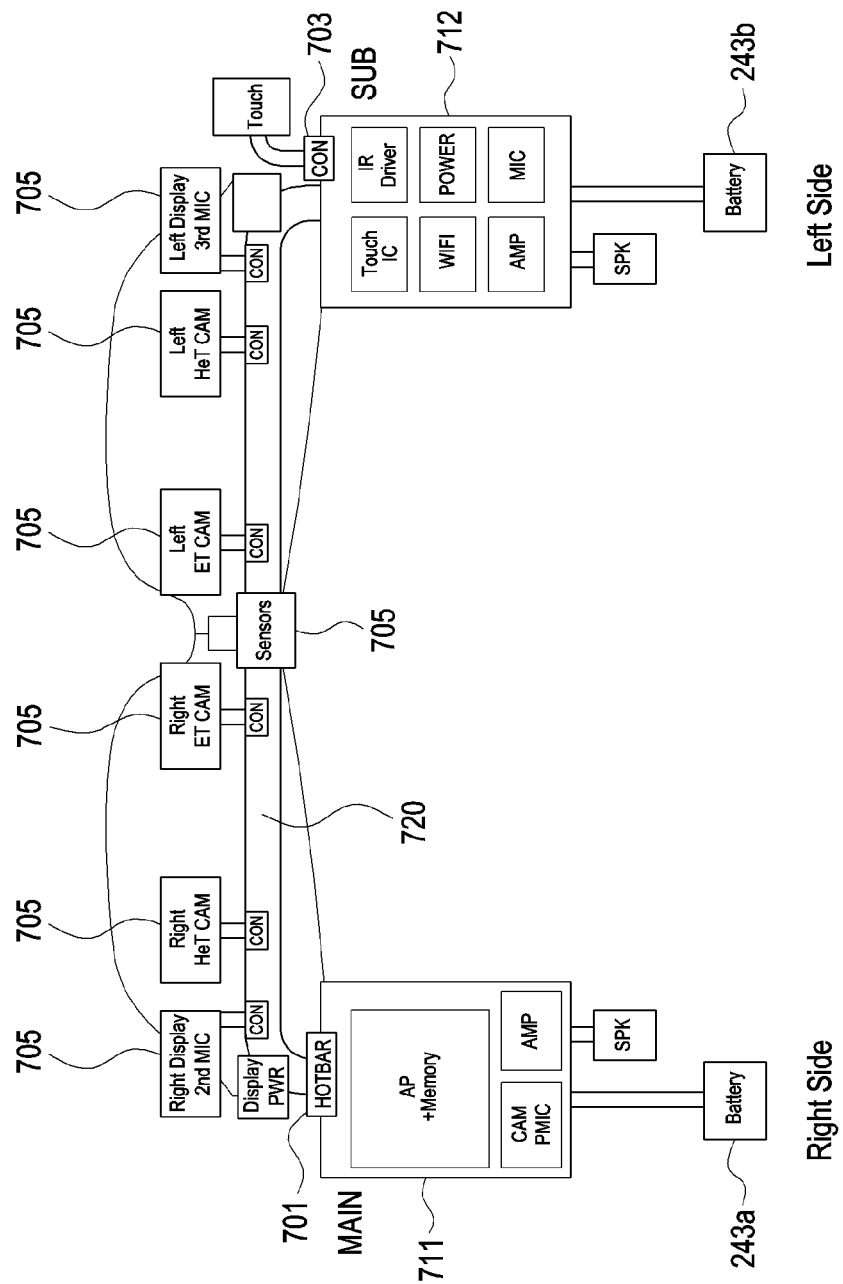
FIG. 7B illustrates a method for connecting an FPCB and the modules to each other according to an embodiment of the disclosure.

Referring to FIG. 6, the first PCB 601 located at the right end of the glasses (e.g., the +X-axis direction in FIG. 6) and including a main system and the second PCB (e.g., the second PCB 712 in FIG. 7B) located at the left end of the glasses (e.g., the −X-axis direction in FIG. 6) and including a sub-system including a charging circuit, batteries (e.g., the first battery 243*a* and the second battery 243*b* in FIG. 2) and/or a speaker (e.g., SPK 704 or SPK 704*a* in FIG. 7A) may be connected to each other via a single FPCB (e.g., the FPCB in FIG. 7B). The FPCB (e.g., the FPCB 720 of FIG. 7B) may be electrically connected to the first PCB (e.g., the first PCB 711 in FIG. 7B) or the second PCB (e.g., the second PCB 712 in FIG. 7B) via a hotbar (e.g., the hotbar 701 in FIG. 7B) or a connector.

FIG. 7A illustrates a method of connecting FPCBs and modules to each other in a glasses-type electronic device according to an embodiment of the disclosure.

Referring to FIG. 7A, a connection structure of a main PCB (e.g., main PCB 711*a* in FIG. 7A), a multi-layered FPCBs (e.g., FPCBs 720*a* in FIG. 7A), and FPCBs and respective modules (e.g., an electronic component(s) 705 in FIG. 7A) in a glasses-type device of the related art is illustrated. A one-to-one connection of a plurality of modules (e.g., the electronic component(s) 705 in FIG. 7A) with respective FPCBs (e.g., FPCBs 720*a* of FIG. 7A) in the main PCB (e.g., the main PCB 711*a* in FIG. 7A) is illustrated.

Referring to FIG. 7A, the main PCB (e.g., the main PCB 711*a* in FIG. 7A) and the sub-PCB (e.g., sub-PCB 712*a* in FIG. 7A) may include one or more components.

Referring to FIG. 7A, each module (e.g., the electronic component(s) 705 in FIG. 7A) may include, for example, a camera (CAM), a microphone (MIC), a display, or a sensor. Each module (e.g., electronic component(s) 705 of FIG. 7A) may be connected to the main PCB (e.g., the main PCB 711*a* in FIG. 7A) by a connector (e.g., CON 703*a* in FIG. 7A).

Referring to FIG. 7A, when a connector (e.g., the CON 703*a* in FIG. 7A) is used for each module (e.g., the electronic component(s) 705 in FIG. 7A), a plurality of connectors (e.g., the CON 703*a* in FIG. 7A) are used. Thus, since the size of the main PCB (e.g., the main PCB 711*a* of FIG. 7A) is increased, and the total thickness is increased due to the use of respective FPCBs (e.g., the FPCBs 720*a* in FIG. 7A), it may be difficult for the main PCB to pass through a hinge (e.g., the hinge structures 229 in FIG. 5), and it may be difficult to bend the temple.

FIG. 7B illustrates a method for connecting an FPCB and modules to each other according to an embodiment of the disclosure.

Referring to FIG. 7B, a first PCB (e.g., a first PCB 711 in FIG. 7B) may be connected to a single FPCB (e.g., a FPCB 720 in FIG. 7B) via a single hotbar (e.g., a hotbar 701 in FIG. 7B) (or a connector). Compared with the embodiment of FIG. 7A in which a plurality of FPCBs (e.g., FPCBs 720*a* in FIG. 7A) are used, since the first PCB (e.g., the first PCB 711 in FIG. 7B) is connected using the single FPCB (e.g., the FPCB 720 in FIG. 7B), and it is possible to minimize the size of the first PCB (e.g., the first PCB 711 in FIG. 7B) and it is possible to connect the first PCB to a plurality of modules (e.g., the electronic component(s) 705 in FIG. 7A) using a plurality of layers included in the single FPCB (e.g., the FPCB 720 in FIG. 7B). For example, when using the single FPCB (e.g., the FPCB 720 in FIG. 7B), since the thickness of wiring lines passing through a hinge from a temple is reduced compared with that in the case in which a plurality of FPCBs (e.g., the FPCBs 720*a* in FIG. 7A) are used as in FIG. 7A, it may be easy to wire the display members, and the folding or unfolding operation of temples may be facilitated.

According to various embodiments, the single FPCB (e.g., the FPCB 720 in FIG. 7B) may include a rigid area 610, which is less flexible than other areas, and a flexible area 620 higher flexible than the rigid area to be bendable, and may include a rigid/flexible area 630 in which areas having different flexibility are compositely coupled to each other without a separate connector. A difference in partial flexibility in the single FPCB (e.g., the FPCB 720 in FIG. 7B) may be implemented through a difference in material or by a partially disposed auxiliary substrate. According to an embodiment, connectors (e.g., the connector 703 in FIG. 7B) connected to the display and the camera module (e.g., the electronic component(s) 705 in FIG. 7B) are located in the middle of the FPCB (e.g., the FPCB 720 in FIG. 7B), and some circuits such as sensors may be mounted (onboard) on the rigid area 610. The flexible area 620 may be flexible to allow the temples to be folded or unfolded.

Figure 8:
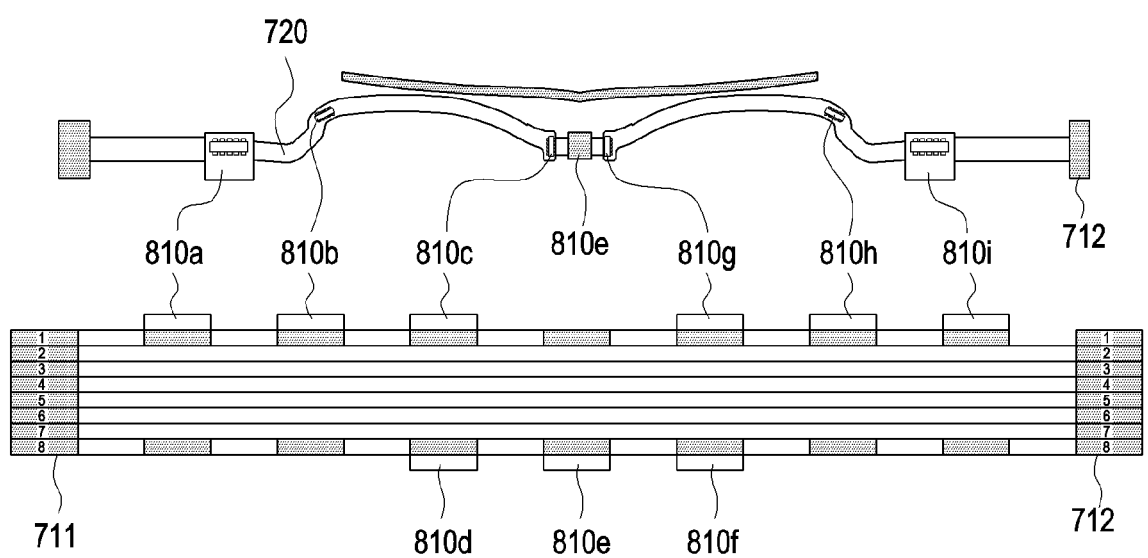
FIG. 8 illustrates wiring lines in respective layers of an FPCB according to an embodiment of the disclosure.

FIG. 8 illustrates wiring lines in respective layers of an FPCB according to an embodiment of the disclosure.

Figure 9:
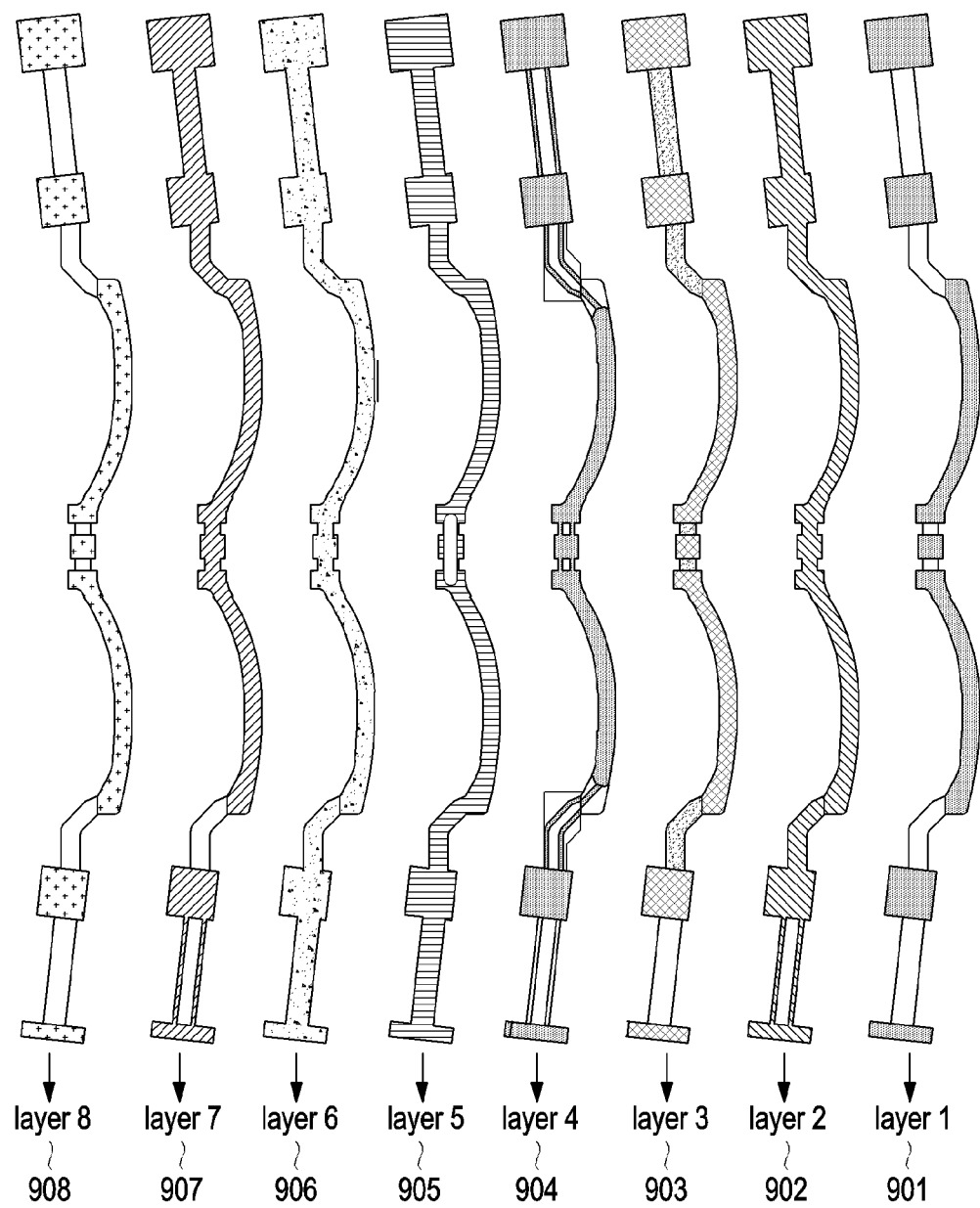
FIG. 9 illustrates a layout for respective layers of an FPCB according to an embodiment of the disclosure.

Referring to FIG. 8, a single FPCB (e.g., a FPCB 720 in FIG. 8) may include a plurality of layers (e.g., layers 2 to 7 in FIG. 8 or layers 2 to 7 (902 to 907) in FIG. 9) for wiring, and in each wiring layer, wiring lines may be disposed for transmission of power or various signals.

According to various embodiments, respective wiring layers (e.g., layers 2 to 7 in FIG. 8 or layers 2 to 7 (902 to 907) in FIG. 9) in the single multi-layered FPCB (e.g., the FPCB 720 in FIG. 8) may be disposed in consideration of signal transmission efficiency or power efficiency by being connected to one or more components such as a power source and a sensor. For example, in the case of the multi-layered FPCB (e.g., the FPCB 720 in FIG. 8), possible to achieve various combinations of a position at which the electronic components (e.g., the electronic component(s) 705 in FIG. 7B), such as a display and a camera, are connected to wiring lines of the FPCB, a final destination as to whether the FPCB (e.g., the FPCB 720 in FIG. 8) is connected to the front portion of AR glasses or hinges, layers in which a wiring line for high-speed signal transmission and a power wiring line (e.g., layers 2 and 7 in FIG. 8), which are separated from each other, are located in the FPCB (e.g., the FPCB 720 in FIG. 8), or the like.

For example, a layer for wiring lines for transmitting high-speed signals, such as an MIPI signal for a display or a camera module, a PCIe interface for a graphics card, solid state drive (SSD), or the like, or an RF for a wireless communication signal such as a Wi-Fi antenna signal, may be located in the uppermost layer or the lowermost layer in a flexible area of the single FPCB (e.g., the FPCB 720 in FIG. 7B). For example, the layer of a wiring line for high-speed signal transmission may be layer 2 or layer 7 in FIG. 8, and may be layer 2 (902) or layer 7 (907) in FIG. 9. An insulating layer (not illustrated) for shielding may be disposed between respective layers, the layer exposed as the top surface or the bottom surface of the FPCB (e.g., the FPCB 720 in FIG. 7B) (which may be, for example, layer 1 or layer 8 in FIG. 8 or layer 1 (901) or layer 8 (908) in FIG. 9) may at least partially function as an electromagnetic shielding structure (e.g., an electromagnetic interference (EMI) sheet). The layers (e.g., layers 3 to 6 in FIG. 8 or layers 3 to 6 (layers 903, 904, 905, and 906) in FIG. 9) disposed between wiring layers for high-speed signal transmission (e.g., layers 2 and 7 in FIG. 8 or layer 2 (902) and layer 7 (907) in FIG. 9) may provide, for example, a power wiring line (e.g., the wiring line of layer 5 in FIG. 8), an interface signal wiring line (e.g., a wiring line in layer 4 in FIG. 8) and/or grounds for impedance matching (e.g., wiring lines or grounds in layer 3 and layer 6 in FIG. 8). In each layer, other signals including the corresponding signal may be additionally located.

According to various embodiments, the first PCB (e.g., the first PCB 711 in FIG. 7B) and the second PCB (e.g., the second PCB 712 in FIG. 7B) may be electrically connected to each other via the single FPCB (e.g., the FPCB 720 in FIG. 7B), and between the first PCB (e.g., the first PCB 711 in FIG. 7B) and the second PCB (e.g., the second PCB 712 in FIG. 7B), first and second wearing members 203a and 203b, one or more hinge structures 229, and components 810a to 810i disposed on the lens frame unit 202 may be electrically connected to the first PCB (e.g., the first PCB 711 in FIG. 7B)) and the second PCB (e.g., the second PCB 712 in FIG. 7B) via the single FPCB (e.g., the FPCB 720 in FIG. 7B). For example, a plurality of modules (e.g., the electronic component(s) 705 in FIG. 7B) may be provided with at least one of a display/MIC 810a and 810i, HeT CAM 810b and 810h, Et CAMs 810d and 810g, IR LEDs 810c and 810f, and sensors 810e and may be electrically connected to the first PCB (e.g., the first PCB 711 in FIG. 7B) or the second PCB (e.g., the second PCB 712 in FIG. 7B) via the FPCB (e.g., the FPCB 720 in FIG. 7B). The FPCB (e.g., the FPCB 720 of FIG. 7B) connected to the first PCB (e.g., the first PCB 711 in FIG. 7B) may include a plurality of layers (e.g., layers 1 to 8 in FIG. 8). For example, respective wiring lines included in the FPCB (e.g., the FPCB 720 in FIG. 7B) may include a layer for a high-speed signal (e.g., layers 2 and 7 in FIG. 8), and a ground for impedance matching (e.g., layers 3 and 6 in FIG. 8), a layer for an interface signal (e.g., layer 4 in FIG. 8), and a layer for main power (e.g., layer 5 in FIG. 8). Each component and the name of the same dielectric constant lower than that of other wiring layers is used in a wiring layer for high-speed signals (e.g., layers 2 and 7 in FIG. 8) used for wiring lines of high-speed signals (e.g., layers 2 and 7 in FIG. 8), it is possible to transmit high-speed signals with low loss rates.

Referring to Table 1, it is possible to compare the loss rates when a low dissipation factor (DO material and a normal Df material are used as wiring materials for FPCBs (e.g., the FPCB 720 in FIG. 7B). For example, it can be seen that, in the case of a Wi-Fi signal, when the low Df material is used at 2.4 GHz frequency, the loss rate is 0.0155 in a rigid area, whereas when the normal Df material is used, the loss rate is 0.029, which is higher than that in the case where the low DF material is used. For example, when a communication module used for transmission of high-speed signals, such as Wi-Fi, PCIe, or RF, and an FPCB (e.g., the FPCB 720 in FIG. 7B) are connected to each other, the communication module and the FPCB may be connected to each other via a wiring line located in the outer layer (e.g., wires for high-speed signals (layers 2 and 7) in FIG. 8) of the FPCB (e.g., the FPCB 720 in FIG. 7B). The layer for a high-speed signal wiring line of the FPCB (e.g., the FPCB 720 in FIG. 7B) is formed of a material having a dielectric constant lower than that of an inner layer (e.g., layers 3 to 6 in FIG. 8), wherein the material of each of the wiring line layers (e.g., the layers 2 to 7 in FIG. 8) may be appropriately selected in consideration of a signal to be transmitted therethrough. A low Df material may be a low dielectric loss material applicable to a coverlay or a prepreg (PPG), but is not limited thereto.

TABLE 1

| | IL per unit length[dB/mm] | | | | | | | | | | | |
|---|---|---|---|---|---|---|---|---|---|---|---|---|
| | Low Df (Flex: 10 μm↑/Rigid 30 μm↑) | | | | Low Df | | | | Normal Df | | | |
| Classification | @2.4 GHz | @5 GHz | @6 GHz | @7 GHz | @2.4 GHz | @5 GHz | @6 GHz | @7 GHz | @2.4 GHz | @5 GHz | @6 GHz | @7 GHz |
| Wifi Rigid portion | 0.0155 | 0.0245 | 0.0275 | 0.0305 | 0.0275 | 0.03 | 0.0365 | 0.0385 | 0.029 | 0.036 | 0.0425 | 0.0455 |
| Wifi Flex portion | 0.024 | 0.028 | 0.0325 | 0.0375 | 0.0425 | 0.0335 | 0.0415 | 0.0505 | 0.041 | 0.052 | 0.063 | 0.067 |
| Classification | @2.5 Ghz | | | | @2.5 GhZ | | | | @2.5 Ghz | | | |
| PCIe Rigid portion | 0.0275 | | | | 0.044 | | | | 0.051 | | | |
| PCIe Flex portion | 0.032 | | | | 0.043 | | | | 0.094 | | | | described in FIG. 7B are described as an example for convenience of description and are not limited to those described in the drawings.

According to various embodiments, materials of the plurality of layers (e.g., layers 1 to 8 in FIG. 8) of the FPCB (e.g., the FPCB 720 in FIG. 7B) may be different from each other. In general, in the FPCB (e.g., the FPCB 720 in FIG. 7B), the same material may be used even for wiring lines of different layers. However, in consideration of the electrical characteristics or losses according to materials, some layers (e.g., a layer that provides a wiring line for high-speed signal transmission) may have a material different from those of other layers (e.g., a layer that provides a wiring line for power or interface). For example, when a material having a FIG. 9 illustrates a layout for respective layers of an FPCB according to an embodiment of the disclosure.

Referring to FIG. 9, a layout of respective layers (e.g., layers 1 to layer 8 (901 to 908) in FIG. 9) of an FPCB is illustrated. For example, in FIG. 9, when a wiring line (e.g., layer 2 (902) or layer 6 (906) in FIG. 9) located on an outer layer of the FPCB (e.g., the FPCB 720 in FIG. 7B) is provided with wiring lines for high-speed signals (e.g., MIPI, PCIe, and/or an RF signal) between a first PCB (e.g., the first PCB 601 in FIG. 6) and a first rigid area of FIG. 6 (e.g., rigid area 610 in FIG. 6), the section (e.g., rigid/flexible area 630 in FIG. 6) from the first rigid area (e.g., the rigid area 610 in FIG. 6) to a second PCB (e.g., the second PCB 602 in FIG. 6) may have a width smaller than that in the section (e.g., flexible area 620 in FIG. 6) between the first PCB (e.g., the first PCB 601 in FIG. 6) and the first rigid area (e.g., rigid area 610 in FIG. 6). For example, since at least some of the signal wiring lines corresponding to MIPI may be omitted, the width of the FPCB in the section (e.g., rigid/flexible area 630 in FIG. 6) between the first rigid area (e.g., rigid area 610 in FIG. 6) and the second PCB (e.g., second PCB 602 in FIG. 6) can be decreased and the flexibility can be increased. As an example, the FPCB (e.g., the FPCB 720 in FIG. 7B) is connected to the second PCB (e.g., the second PCB 602 in FIG. 6) while being connected to respective modules (e.g., components 810*a* to 810*i* in FIG. 8), so that signals are drawn to the respective modules. Therefore, the width of the FPCB (e.g., FPCB 720 in FIG. 7B) becomes smaller gradually or stepwise toward the second PCB (e.g., the second PCB 602 in FIG. 6). In some embodiments, the width of the FPCB (e.g., the FPCB 720 in FIG. 7B) may be substantially uniform between the first PCB (e.g., the first PCB 601 in FIG. 6) and the second PCB (e.g., the second PCB 602 in FIG. 6), and in this case, the inner wiring lines may be more simplified toward the second PCB (e.g., the second PCB 602 in FIG. 6). For example, the wiring lines in a partial section (e.g., partial section 650 in FIG. 6) of the FPCB (e.g., the FPCB 720 in FIG. 7B) adjacent to the second PCB (e.g., the second PCB 602 in FIG. 6) may be more simplified than those of another partial section (e.g., flexible area 620 in FIG. 6) of the FPCB (e.g., the FPCB 720 in FIG. 7B) adjacent to the first PCB. For example, there may be empty portions in which wiring lines are not present, such as the end portions of layer 2 (902) and layer 7 (907) in FIG. 9A, and the corresponding layer in which wiring lines are not present may be at least partially deleted to improve the bendability or flexibility of the FPCB (e.g., the FPCB 720 in FIG. 7B). In another embodiment, when the width of the FPCB (e.g., FPCB 720 in FIG. 7B) is reduced in the section in which wiring lines are simplified (e.g., partial section 650 in FIG. 6), a margin space can be secured in an area passing through the hinge. Since a coaxial cable connected to a Wi-Fi antenna is able to pass through the secured margin space, it is possible to reduce transmission loss in wireless communication.

Figure 10A:
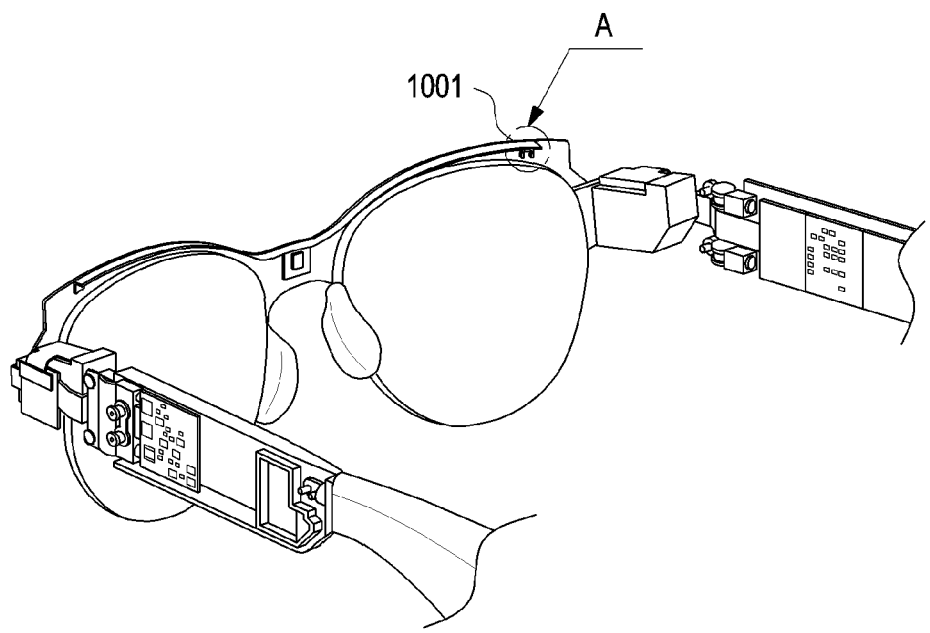
FIGS. 10A and 10B illustrate a dedicated FPCB for power reinforcement, according to various embodiments of the disclosure.
Figure 10B:
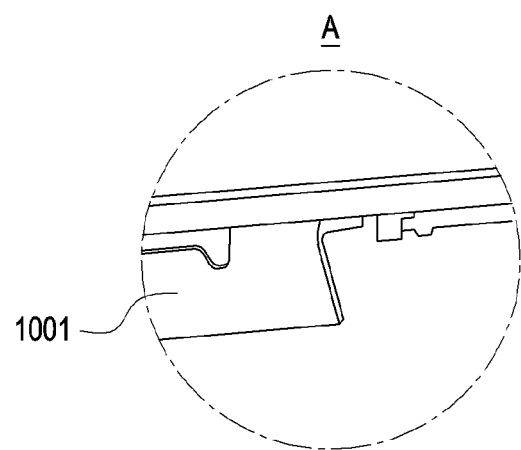

FIGS. 10A and 10B illustrate a dedicated FPCB for power reinforcement according to various embodiments of the disclosure.

According to various embodiments, a wiring line for main power (e.g., layer 5 in FIG. 8) may be located in an inner layer of the single FPCB (e.g., the FPCB 720 in FIG. 7B). By additionally locating a conductive member (e.g., conductive member 1001 in FIGS. 10A and 10B) in an upper empty space of the rim (e.g., the lens frame unit 202 of FIGS. 2 to 4) as in FIG. 10A or 10B in order to improve an IR drop of power in the FPCB (e.g., the FPCB 720 in FIG. 7B), it is possible to improve an IR drop in the FPCB (e.g., the FPCB 720 in FIG. 7B) and enhance the degree of freedom of signal wiring by separating a power supply separately. For example, the conductive member (e.g., conductive member 1001 in FIGS. 10A and 10B) may include an FPCB or a coaxial cable. At this time, in a single FPCB (e.g., the FPCB 720 in FIG. 7B), a power wiring line may be drawn out to the outer layer through a via and may be connected to a conductive member (e.g., conductive member 1001 in FIGS. 10A and 10B) via a board-to-board connector or a contact connector, or through soldering.

The electronic device 200 of the disclosure is, for example, a glasses-type AR device, wherein a first PCB (e.g., the first PCB 601 in FIG. 6) including a main system may be disposed in at least one wearing member (e.g., wearing members 203), and wiring lines from the first FPCB (e.g., the first PCB 601 in FIG. 6) to respective components (e.g., a camera, a display, an audio module, and a sensor) and/or a second PCB (e.g., the second PCB 602 in FIG. 6) may be provided using a single multi-layered FPCB (e.g., the FPCB 720 in FIG. 7B). Even when wired through a hinge structure 299, the FPCB (e.g., the FPCB 720 in FIG. 7B) may have the effects of minimizing the sizes of the PCBs, reducing the size of the glasses, and simplifying the assembly process while enabling the temples to be smoothly folded or unfolded. In addition, in the FPCB (e.g., the FPCB 720 in FIG. 7B), when the material of the uppermost layer or the lowermost layer among the layers providing signal wiring lines is different from that of the inner layers, it is possible to transmit a high-speed signal with low loss.

According to various embodiments of the disclosure, a glasses-type electronic device (e.g., the electronic device 200 in FIG. 2) may include a housing (e.g., the housing 210 in FIG. 2), a lens frame unit (e.g., the lens frame unit 202 in FIG. 2) provided as a part of the housing, at least one camera module (e.g., the camera module 250 in FIG. 2) or at least one display module (e.g., the display module 160 in FIG. 2) disposed on the lens frame unit, a first wearing unit (e.g., the first wearing member 203*a* in FIG. 3) extending from one end of the lens frame unit and including a first PCB disposed therein, a second wearing unit (e.g., the second wearing member 203*b* in FIG. 3) extending from the other end of the lens frame unit and including a second PCB disposed therein, and a flexible PCB (FPCB) (e.g., the FPCB 720 in FIG. 7B) extending from the first PCB through the second lens frame unit to be electrically connected to the second PCB. Inside the lens frame unit, the FPCB may be electrically connected to at least one of the camera module or the display module.

According to various embodiments of the disclosure, the FPCB and the first PCB may be electrically connected to each other using a single connector.

According to various embodiments of the disclosure, a battery electrically connected to the second PCB may be located at a terminal end of the second wearing unit.

According to various embodiments of the disclosure, the FPCB may be electrically connected from a battery, which is located at a terminal end of the first wearing unit and electrically connected to the first PCB, to the battery, which is electrically connected to the second PCB.

According to various embodiments of the disclosure, the FPCB may include a plurality of layers configured to provide a power or signal wiring line, a first wiring line for a first signal, which is disposed in at least one of the uppermost layer or the lowermost layer among the plurality of layers, and a second wiring line for a second signal, which is disposed in an inner layer disposed between the uppermost layer and the lowermost layer among the plurality of layers, wherein the first signal may have a higher speed than that of the second signal.

According to various embodiments of the disclosure, the first wiring line may be formed of a material different from that of the second wiring line.

According to various embodiments of the disclosure, the display module may include a first display module and a second display module, the camera module may include a first camera module and a second camera module, and the FPCB, the first display module, and the second display module, the first camera module, and the second camera module may be electrically connected to any one of the first PCB and the second PCB via the FPCB.

According to various embodiments of the disclosure, the FPCB may be further electrically connected to an eye tracking module.

According to various embodiments of the disclosure, it is possible to propose the glasses-type electronic device (e.g., the electronic device 200 in FIG. 2) including a housing (e.g., the housing 210 in FIG. 2), a lens frame unit (e.g., the lens frame unit 202 in FIG. 2) provided as a part of the housing, a first wearing unit (e.g., the first wearing member 203a in FIG. 3) extending from one end of the lens frame unit, a first PCB accommodated in the first wearing unit, a second wearing unit (e.g., the second wearing member 203b in FIG. 3) extending from the other end of the lens frame unit, a second PCB accommodated in the second wearing unit, and a flexible PCB (FPCB) (e.g., the FPCB 720 in FIG. 7B) extending from the first PCB through the lens frame unit and electrically connected to the second PCB. Inside the lens frame unit, the FPCB may include a plurality of layers configured to provide a power or signal wiring line and may include, in the plurality of layers, a first wiring line for a first signal, which is disposed in at least one of the uppermost layer or the lowermost layer among the plurality of layers that provide the signal wiring line, and a second wiring line for a second signal, which is disposed in an inner layer disposed between the uppermost layer and the lowermost layer among the plurality of layers, and wherein the first signal has a higher speed than that of the second signal.

According to various embodiments of the disclosure, the first wiring line may be formed of a material having a dielectric constant lower than that of the second wiring line.

According to various embodiments of the disclosure, the first wiring line may be formed of a material having a signal loss lower than that of the second wiring line.

According to various embodiments of the disclosure, the glasses-type electronic device may further include a camera module or a display disposed in the lens frame unit, wherein the camera module or the display may be electrically connected to a connector disposed on the FPCB.

According to various embodiments of the disclosure, at least a portion of the uppermost layer or the lowermost layer of the FPCB may be covered with an EMI sheet (or tape) for shielding.

According to various embodiments of the disclosure, in a section between the connector and the second PCB, the FPCB may have a width smaller than that of a section between the connector and the first PCB.

According to various embodiments of the disclosure, the FPCB may be a single FPCB including a plurality of wiring lines, and a wiring line for main power may be located in an inner layer of the FPCB.

According to various embodiments of the disclosure, the glasses-type electronic device may further include a conductive member electrically connected to the single FPCB and disposed in the lens frame unit, wherein the conductive member may be located in an upper end portion of the lens frame unit to prevent a voltage drop (an IR drop).

According to various embodiments of the disclosure, the FPCB may include a plurality of layers that provide the power or signal wiring line, and the FPCB may be electrically connected to at least one of a camera module, a display module, an audio module, and a sensor.

According to various embodiments of the disclosure, the glasses-type electronic device may include a hotbar structure disposed on the first PCB, wherein the FPCB may be electrically connected to the first PCB via the hotbar structure.

According to various embodiments of the disclosure, the glasses-type electronic device may further include a battery accommodated at a terminal end of the second wearing unit, wherein the battery may be electrically connected to the second PCB.

According to various embodiments of the disclosure, the display module may include a first display module and a second display module, the camera module may include a first camera module and a second camera module, and the FPCB may be electrically connected to the first display module, the second display module, the first camera module, and the second camera module.

According to various embodiments of the disclosure, the FPCB may further be electrically connected to an eye tracking module.

According to various embodiments of the disclosure, a glasses-type electronic device may include a flexible PCB (FPCB), a main PCB electrically connected to an end of the FPCB, and a sub-PCB electrically connected to the other end of the FPCB. At least a partial area of the FPCB may include a connector configured to be connectable to one or more components of the glasses-type electronic device. The FPCB may include a plurality of layers configured to provide a power or signal wiring line and may include, in the plurality of layers, a first wiring line for a first signal, which is disposed in at least one of the uppermost layer or the lowermost layer of the layers that provide the signal wiring line, and a second wiring line for a second signal, which is disposed in an inner layer disposed between the uppermost layer and the lowermost layer among the plurality of layers, wherein the first signal may have a higher speed than that of the second signal.

According to various embodiments of the disclosure, when a first component connected via the connector receives the first signal, the first signal may be transmitted to the main PCB via the first wiring line of a layer for the first component.

According to various embodiments of the disclosure, a sheet or tape for shielding may be attached to a layer that provides the first wiring line.

According to various embodiments of the disclosure, in the plurality of layers included in the FPCB, a layer including the first wiring line may use a material different from that of wirings in other layers in order to reduce the signal loss.

According to various embodiments of the disclosure, the glasses-type electronic device may further include rotatable hinge units of the glasses-type electronic device at the one end and the other end of the FPCB, respectively, wherein the FPCB may be connected to the main PCB and the sub PCB via the hinge units, respectively.

According to various embodiments of the disclosure, a power transmission wiring line may be located in an inner layer disposed between the uppermost layer and the lowermost layer.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:
1. A glasses-type electronic device comprising:
   a housing;
   a lens frame provided as a part of the housing;
   a first wearing member extending from a first end of the
      lens frame;

a first printed circuit board (PCB) accommodated in the first wearing member;

a second wearing member extending from a second end of the lens frame;

a second PCB accommodated in the second wearing member; and a flexible PCB (FPCB) extending from the first PCB through the lens frame and electrically connected to the second PCB, the FPCB being a single FPCB including a plurality of layers; and a conductive member electrically connected to the single FPCB and disposed in the lens frame, wherein the FPCB comprises the plurality of layers providing at least one of a power wiring line or a signal wiring line, wherein the FPCB further comprises, a first wiring line for a first signal, which is disposed in at least one of an uppermost layer or a lowermost layer of the plurality of layers, and a second wiring line configured to transmit a second signal, which is disposed in an inner layer disposed between the uppermost layer and the lowermost layer among the plurality of layers, wherein the first signal has a higher speed than a speed of the second signal and wherein the conductive member is located at an upper end of the lens frame and configured to prevent at least one of a voltage drop or an infrared (IR) drop.

2. The glasses-type electronic device of claim 1, wherein the first wiring line is formed of a material having a dielectric constant lower than a dielectric constant of the second wiring line.

3. The glasses-type electronic device of claim 1, wherein the FPCB further comprises an electromagnetic interference (EMI) sheet providing an electromagnetic shielding structure to the first wiring line or the second wiring line.

4. The glasses-type electronic device of claim 1, further comprising:
a camera or a display disposed in the lens frame,
wherein the camera or the display is electrically connected to a connector disposed on the FPCB.

5. The glasses-type electronic device of claim 4, wherein, in a section between the connector and the second PCB, the FPCB has a width smaller than a width of a section between the connector and the first PCB.

6. The glasses-type electronic device of claim 1, wherein the second wiring line includes the power wiring line.

7. The glasses-type electronic device of claim 1, wherein the FPCB is electrically connected to at least one of a camera, a display, an audio, or a sensor.

8. The glasses-type electronic device of claim 7, wherein the display comprises a first display and a second display,
wherein the camera comprises a first camera and a second camera, and
wherein the FPCB is electrically connected to the first display, the second display, the first camera, and the second camera.

9. The glasses-type electronic device of claim 1, further comprising:
a hotbar structure disposed on the first PCB,
wherein the FPCB is electrically connected to the first PCB via the hotbar structure.

10. The glasses-type electronic device of claim 1, further comprising:
a battery accommodated at a terminal end of the second wearing member, wherein the battery is electrically connected to the second PCB.

11. The glasses-type electronic device of claim 1, wherein the FPCB is further electrically connected to an eye tracking module.

12. The glasses-type electronic device of claim 1, further comprising:
a connector located in at least a partial area of the FPCB and configured to be connectable to at least one or more components of the glasses-type electronic device,
wherein the first PCB is electrically connected to a first end of the FPCB,
wherein the second PCB is electrically connected to a second end of the FPCB, and
wherein, based on a first electronic component disposed on the first PCB receiving a first signal, the first signal is transmitted to the second PCB via the first wiring line.

13. The glasses-type electronic device of claim 1, further comprising:
a hinge structure rotatably connected to the lens frame,
wherein the FPCB is connected to each of the first PCB and the second PCB via the hinge structure.

14. The glasses-type electronic device of claim 1, wherein the inner layer includes the power wiring line.

15. The glasses-type electronic device of claim 1, wherein the first signal of the first wiring line disposed in the uppermost layer or the lowermost layer comprises at least one of a mobile industry processor interface (MIPI) signal for a display or a camera, a peripheral component interconnect express (PCIe) interface signal for a graphics card or solid state drive (SSD), a radio frequency (RF) signal for wireless communication, or a wireless fidelity (Wi-Fi) antenna signal.

16. The glasses-type electronic device of claim 1, wherein the second wiring line disposed in the inner layer between the uppermost layer and the lowermost layer comprises at least one of a power wiring line, an interface signal wiring line, or wiring lines or grounds for impedance matching.

17. The glasses-type electronic device of claim 1, wherein the uppermost layer comprises a wiring line for high-speed signal transmission and the lowermost layer comprises a power wiring line.

18. A glasses-type electronic device comprising:
a housing;
a lens frame provided as a part of the housing;
a camera or a display disposed in the lens frame;
a first wearing member extending from one end of the lens frame;
a first printed circuit board (PCB) disposed in the first wearing member;
a second wearing member extending from another end of the lens frame;
a second PCB disposed in the second wearing member;
a flexible PCB (FPCB) connected to the first PCB using single connector, the FPCB being a single FPCB including a plurality of layers;
a hinge structure rotatably connected to the lens frame; and
a conductive member electrically connected to the single FPCB and disposed in the lens frame,
wherein the FPCB comprises a plurality of layers electrically connected to the second PCB through the lens frame,
wherein the FPCB is electrically connected to at least one of the camera or the display, wherein the FPCB is connected to the first PCB and the second PCB through the hinge structure, and wherein the conductive member is located at an upper end of the lens frame and configured to prevent at least one of a voltage drop or an infrared (IR) drop.

19. The glasses-type electronic device of claim 18, wherein an outer layer of the plurality of layers of FPCB includes a signal wiring line configured to transmit a high speed signal, and wherein the signal wiring line is electrically connected to an electrical component disposed in the lens frame, the first wearing member or the second wearing member.

20. The glasses-type electronic device of claim 18, further comprising:

a battery disposed in the first wearing member or the second wearing member, wherein an inner layer of the plurality of layers of FPCB includes a power wiring line, and wherein power of the battery is configured to transmit by the inner layer of the plurality of layers of FPCB to an electrical component disposed in the lens frame, the first wearing member or the second wearing member.

\* \* \* \* \*